(12) United States Patent
Russell et al.

(10) Patent No.: US 8,179,026 B2
(45) Date of Patent: May 15, 2012

(54) NANOTUBES, NANORODS AND NANOWIRES HAVING PIEZOELECTRIC AND/OR PYROELECTRIC PROPERTIES AND DEVICES MANUFACTURED THEREFROM

(75) Inventors: Thomas P. Russell, Amherst, MA (US); Jodie Lutkenhaus, Wethersfield, CT (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 12/551,039

(22) Filed: Aug. 31, 2009

(65) Prior Publication Data

US 2010/0060109 A1    Mar. 11, 2010

Related U.S. Application Data

(60) Provisional application No. 61/094,287, filed on Sep. 4, 2008.

(51) Int. Cl.
*H01L 41/08* (2006.01)
(52) U.S. Cl. ............ 310/358; 310/319; 310/311
(58) Field of Classification Search .......... 310/357–359, 310/800
See application file for complete search history.

(56) References Cited

U.S. PATENT DOCUMENTS

| | | | | |
|---|---|---|---|---|
| 4,518,889 | A * | 5/1985 | 'T Hoen | 310/357 |
| 4,755,707 | A * | 7/1988 | Nakaya et al. | 310/334 |
| 6,620,287 | B2 * | 9/2003 | Cass | 156/296 |
| 6,634,071 | B2 * | 10/2003 | Benjamin | 29/25.35 |
| 6,979,938 | B2 * | 12/2005 | Solberg | 310/358 |
| 7,382,082 | B2 * | 6/2008 | Bhardwaj | 310/357 |
| 7,443,082 | B2 * | 10/2008 | Grumm | 310/339 |
| 7,764,004 | B2 * | 7/2010 | Aizenberg et al. | 310/311 |
| 2004/0000661 | A1 * | 1/2004 | Sato | 252/299.01 |
| 2008/0033298 | A1 * | 2/2008 | Habu et al. | 600/459 |
| 2008/0129278 | A1 * | 6/2008 | Dai et al. | 324/109 |
| 2008/0251865 | A1 * | 10/2008 | Pinkerton | 257/414 |
| 2010/0102033 | A1 * | 4/2010 | Choi et al. | 216/101 |

OTHER PUBLICATIONS

M. Steinhart, et al. "Curvature-Directed Crystallization of Poly(vinylidene difluoride) in Nanotube Walls"; Macromolecules (2003) pp. 3646-3651; vol. 36; American Chemical Society.
R.K. Zheng, et al. "A Simple Template-Based Hot-Press Method for the Fabrication of Metal and Polymer Nanowires and Nanotubes"; Nanotechnology (2005) pp. 1928-1934; vol. 16; Institute of Physics Publishing, IOP Publishing Ltd., Uk.
Z.L. Wang, et al. "Piezoelectric Nanogenerators Based on Zinc Oxide Nanowire Arrays"; Science (Apr. 14, 2006) pp. 242-246; vol. 312; www.sciencemag.org.
X. Wang, et al. "Direct-Current Nanogenerator Driven by Ultrasonic Waves"; Science (Apr. 6, 2007) pp. 102-105; vol. 316; www.sciencemag.org.
C-L. Sun, et al. "Fabrication and Characterization of Ni/P (VDF-TrFE) Nanoscaled Coaxial Cables" Applied Physics Letters (2007) vol. 90, 253107-1; American Institute of Physics.

* cited by examiner

*Primary Examiner* — Mark Budd
(74) *Attorney, Agent, or Firm* — Cantor Colburn LLP (57) ABSTRACT

Disclosed herein is a device comprising a pair of electrodes; and a nanotube, a nanorod and/or a nanowire; the nanotube, nanorod and/or nanowire comprising a piezoelectric and/or pyroelectric polymeric composition; the pair of electrodes being in electrical communication with opposing surfaces of the nanotube, nanorod and/or a nanowire; the pair of electrodes being perpendicular to a longitudinal axis of the nanotube, nanorod and/or a nanowire.

20 Claims, 5 Drawing Sheets

NANOTUBES, NANORODS AND NANOWIRES HAVING PIEZOELECTRIC AND/OR PYROELECTRIC PROPERTIES AND DEVICES MANUFACTURED THEREFROM

CROSS-REFERENCE TO RELATED APPLICATIONS

This application claims priority to provisional application 61/094,287 filed on Sep. 4, 2008, the entire contents of which are hereby incorporated by reference.

STATEMENT REGARDING FEDERALLY SPONSORED RESEARCH & DEVELOPMENT

The U.S. Government has certain rights in this invention pursuant to the U.S. Department of Energy Grant No. DE-FG02-96ER45612, and National Science Foundation Materials Research Science and Engineering Center Grant No. FA9550-06-1-0022.

BACKGROUND

This disclosure relates to nanotubes and nanorods having piezoelectric properties and to devices manufactured therefrom. More specifically, this disclosure relates to nanotubes and nanorods that comprise polyvinylidene fluoride that can be used in actuators or sensors.

Piezoelectricity or pyroelectricity is the ability of some materials to generate an electrical potential in response to applied mechanical or thermal stimuli, respectively. The piezoelectric effect is reversible in that materials that exhibit the direct piezoelectric effect (the production of electricity when stress is applied) also exhibit the converse piezoelectric effect (the production of stress and/or strain when an electric field is applied). As a result of these advantageous properties, piezoelectric materials are used in a variety of applications such as for example, the production and detection of sound, the generation of high voltages, electronic frequency generation, microbalances and the ultrafine focusing of optical assemblies.

The piezoelectric effect is demonstrated by a variety of naturally occurring materials as well as man made materials. Examples of naturally occurring piezoelectric materials are quartz, Rochelle salt, cane sugar, topaz, bone, and the like, while examples of man made piezoelectric materials are barium titanate, gallium orthophosphate, lead titanate, lead zirconate titanate, potassium niobate, lithium niobate, lithium tantalate, polyvinylidene fluoride, and the like.

Polyvinylidene fluoride is a polymeric material that exhibits piezoelectricity in an amount that is several times greater than that exhibited by quartz. As a result polyvinylidene fluoride films are often mentioned as candidates for potential commercial applications in electromechanical and thermomechanical transducers, acoustic, infrared and temperature sensors, vibration, impact and stress/strain sensors, microactuators and switches, ultrasonic devices, power generators, microphones and hydrophones.

Polyvinylidene fluoride and its copolymers are a primary means of achieving mechanical and thermal sensitivities owing to its piezoelectric and pyroelectric properties. However, these properties have only been realized as bulk films. The bulk films unfortunately display low resolution sensing. Bulk films of polyvinylidene fluoride possess excellent piezoelectric and pyroelectric coefficients ($32 \times 10^{-12}$ coulombs per newton and $4 \times 10^{-9}$ coulombs per square centimeter-Kelvin, respectively), which interface well with commercially available instrumentation. In theory, a bench-top electrometer capable of detecting 10 femtocoulombs to 20 microcoulombs interfaced with 1 square centimeter bulk polyvinylidene fluoride film, should be capable of detecting a pressure as low as 3 Pascals or a temperature shift of 2.5 microKelvin. However, in reality it is difficult to produce bulk polyvinylidene fluoride films that can display the aforementioned characteristics. Problems associated with the processing (e.g., melt-processing and solution casting) of bulk polyvinylidene fluoride based materials limit the size of the films produced. As a result, these materials cannot successfully be interfaced with nano- and micro-electro-mechanical systems thereby limiting their capabilities. The application of bulk polyvinylidene fluoride based materials to high resolution two-dimensional piezoelectric sensors, actuators, and the like, therefore continues to remain a challenge.

It is therefore desirable to develop piezoelectric polymeric structures that can be used for applications that involve sensors, actuators, and the like, and that can interface with devices that have nanometer sized and micron sized dimensions.

SUMMARY

Disclosed herein is a device comprising a pair of electrodes; and a nanotube, a nanorod and/or a nanowire; the nanotube, nanorod and/or nanowire comprising a piezoelectric and/or pyroelectric polymeric composition; the pair of electrodes being in electrical communication with opposing surfaces of the nanotube, nanorod and/or a nanowire; the pair of electrodes being perpendicular to a longitudinal axis of the nanotube, nanorod and/or a nanowire.

Disclosed herein is a method of manufacturing a device comprising disposing a piezoelectric and/or pyroelectric polymeric composition in the pores of a template; the pores being substantially parallel to each other; disposing a pair of electrodes on opposing faces of the template; removing the template to leave behind a nanotube, a nanorod and/or a nanowire; the nanotube, the nanorod and/or the nanowire being in electrical communication with the pair of electrodes; the pair of electrodes being perpendicular to a longitudinal axis of the nanotube and/or the nanorod.

BRIEF DESCRIPTION OF FIGURES

FIG. 4 is an exemplary depiction of a device that comprises nanotubes, nanorods and/or nanowires that can be used as a sensor, an actuator, or the like.

DETAILED DESCRIPTION

The terms "the", "a" and "an" do not denote a limitation of quantity, but rather denote the presence of at least one of the referenced item. The suffix "(s)" as used herein is intended to include both the singular and the plural of the term that it modifies, thereby including at least one of that term (e.g., the colorant(s) includes at least one colorants). Unless defined otherwise, technical and scientific terms used herein have the same meaning as is commonly understood by one of skill in the art. As used herein, the terms "first," "second." and the like do not denote any order or importance, but rather are used to distinguish one element from another.

As used herein, approximating language can be applied to modify any quantitative representation that can vary without resulting in a change in the basic function to which it is related. Accordingly, a value modified by a term or terms, such as "about" and "substantially," cannot to be limited to the precise value specified, in some cases. In at least some instances, the approximating language can correspond to the precision of an instrument for measuring the value. Thus the modifier "about" used in connection with a quantity is inclusive of the stated value and has the meaning dictated by the context (e.g., includes the degree of error associated with measurement of the particular quantity).

The notation "±10%" means that the indicated measurement can be from an amount that is minus 10% to an amount that is plus 10% of the stated value. Furthermore, all ranges disclosed herein are inclusive of the endpoints and are independently combinable. The endpoints of all ranges directed to the same component or property are inclusive and independently combinable (e.g., ranges of "less than or equal to about 25 wt %, or, more specifically, about 5 wt % to about 20 wt %," is inclusive of the endpoints and all intermediate values of the ranges of "about 5 wt % to about 25 wt %," etc.).

"Optional" or "optionally" means that the subsequently described event or circumstance can or can not occur, and that the description includes instances where the event occurs and instances where it does not. All cited patents, patent applications, and other references are incorporated herein by reference in their entirety As used herein, "substrate" or "substrates" can be used interchangeably with "surface" or "surfaces."

Disclosed herein is a method of producing nanotubes, nanorods or nanowires that comprise a piezoelectric and/or pyroelectric polymeric composition. Disclosed herein too is a method of manufacturing a device that comprises a pair of electrodes in electrical communication with a nanorod, a nanotube, a nanowire or a combination thereof; the nanorod, the nanotube and the nanowire comprising a piezoelectric and/or pyroelectric polymeric composition. The piezoelectric and/or pyroelectric polymeric composition comprises an organic polymeric material that displays piezoelectric and/or pyroelectric properties. In an exemplary embodiment, the piezoelectric and/or pyroelectric polymeric composition comprises polyvinylidene fluoride.

The method comprises packing the nanometer sized pores of a template with the piezoelectric and/or pyroelectric polymeric composition, disposing electrodes onto opposing surfaces of the template followed by selectively etching away the template to yield arrays of nanotubes, nanorods and/or nanowires that are disposed between the electrodes. In one embodiment, the nanotubes, nanorods and/or nanowires are disposed between the electrodes so that the opposing flat faces of the respective nanotubes, nanorods and/or nanowires are in electrical communication with the electrodes.

The method advantageously provides the capability to form (a) high-resolution 2-dimensional sensing arrays comprising piezoelectric and pyroelectric polyvinylidene fluoride-containing nanotubes, nanorods and/or nanowires; and (b) nanoscale sensing devices using individual polyvinylidene fluoride-containing nanotubes, nanorods and/or nanowires. The electrodes with the nanotubes, nanorods and/or nanowires disposed therebetween can advantageously be used in articles or devices such as sensors, actuators, switches, power generation equipment and the like.

As noted above the nanotubes, nanorods and/or nanowires are obtained from a piezoelectric and/or pyroelectric polymeric composition. The piezoelectric and/or pyroelectric polymeric composition generally comprises a piezoelectric and/or pyroelectric polymer. A suitable example of a piezoelectric and pyroelectric polymer is polyvinylidene fluoride.

Blends and copolymers of the polyvinylidene fluoride can also be used in the piezoelectric and/or pyroelectric polymeric composition. The copolymers can include block copolymers, alternating block copolymers, random copolymers, random block copolymers, graft copolymers, star block copolymers, or the like, or a combination comprising at least one of the foregoing thermoplastic polymers.

Examples of suitable polymers that can be copolymerized with polyvinylidene fluoride are polytrifluoroethylene, polytetrafluoroethylene, polyacrylamide, polyhexafluoropropylene, polyacrylic acid, poly-(N-isopropylacrylamide), polyacetals, polyolefins, polyacrylics, polycarbonates, polystyrenes, polyesters, polyamides, polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polypyrroles, polyacetylenes, polyanilines, polythiophenes, or the like, or a combination comprising at least one of the foregoing thermoplastic polymers.

The piezoelectric and/or pyroelectric polymeric composition may comprise other fillers that display piezoelectric and/or pyroelectric properties. Examples of these piezoelectric fillers are quartz, berlinite, topaz, tourmaline group materials, barium titanate, lead titanate, lead zirconate titanate, potassium niobate, lithium niobate, lithium tantalate, sodium tungstate, $Ba_2NaNb_5O_5$, $Pb_2KNb_5O_{15}$, or the like, or a combination comprising at least one of the foregoing piezoelectric fillers. Examples of fillers that display pyroelectric properties are gallium nitride, cesium nitrate, derivatives of phenylpyrazine, cobalt phthalocyanine, lithium tantalite, or the like, or a combination comprising at least one of the foregoing pyroelectric fillers.

When piezoelectric and/or pyroelectric fillers are added to the piezoelectric and/or pyroelectric polymeric composition, they can be added in amounts of up to about 50 weight percent (wt %), specifically in amounts of about 0.001 to about 5 wt % and more specifically in amounts of about 0.01 to about 1 wt %, based on the total weight of the piezoelectric and/or pyroelectric polymeric composition.

In one embodiment, nanosized electrically conducting fillers may be added to the piezoelectric and/or pyroelectric polymeric composition. Examples of nanosized electrically conducting fillers are single wall carbon nanotubes, multiwall carbon nanotubes, carbon black, intrinsically conducting polymers, or the like, or a combination comprising at least one of the foregoing nanosized electrically conducting fillers.

The electrically conducting fillers can be added in amounts up to about 80 weight percent (wt %), specifically about 0.1 to about 60 wt %, specifically about 2 to about 40 wt %, and more specifically about 5 to about 20 wt %, based on the total weight of the piezoelectric and/or pyroelectric polymeric composition. While the electrically conducting fillers can be used in the piezoelectric and/or pyroelectric polymeric composition, it is desirable to use them in amounts that are less than that which produce percolation through the piezoelectric and/or pyroelectric polymeric composition.

The nanotubes, nanorods and/or nanowires may have dimensions similar to those of the pores present in the template. Template dimensions are discussed below. For example, the nanotubes, nanorods and/or nanowires generally have diameters of about 5 to 400 nanometers, specifically about 20 to about 300 nanometers, and more specifically about 30 to about 100 nanometers. The nanorod and/or nanotube lengths can range from sub-micrometer sized dimensions to hundreds of micrometers. The nanorod and/or nanotube lengths are about 100 nanometers to about 100 micrometers, specifically about 200 nanometers to about 50 micrometers and more specifically about 300 nanometers to about 10 micrometers. The nanotubes, nanorods and/or nanowires generally have an aspect ratio about 5 to about 10,000, specifically about 10 to about 1,000, and more specifically about 15 to about 100. In one embodiment, it is desirable for the nanorod and/or nanotube diameters to have a narrow polydispersity index of less than or equal to about 1.1, specifically less than or equal to about 1.08 and more specifically less than or equal to about 1.05. In one embodiment, it is desirable for the nanorod and/or nanotube density to be about $10^8$ to about $10^{11}$ per square centimeter (/cm$^2$) of electrode surface area, specifically about $10^9$ to about $10^{10}$/cm$^2$ of electrode surface area.

The following paragraphs are directed to equipment used to make the nanorods, nanotubes and/or nanowires and to devices that contain the nanorods, nanotubes and/or nanowires.

Figure 1:
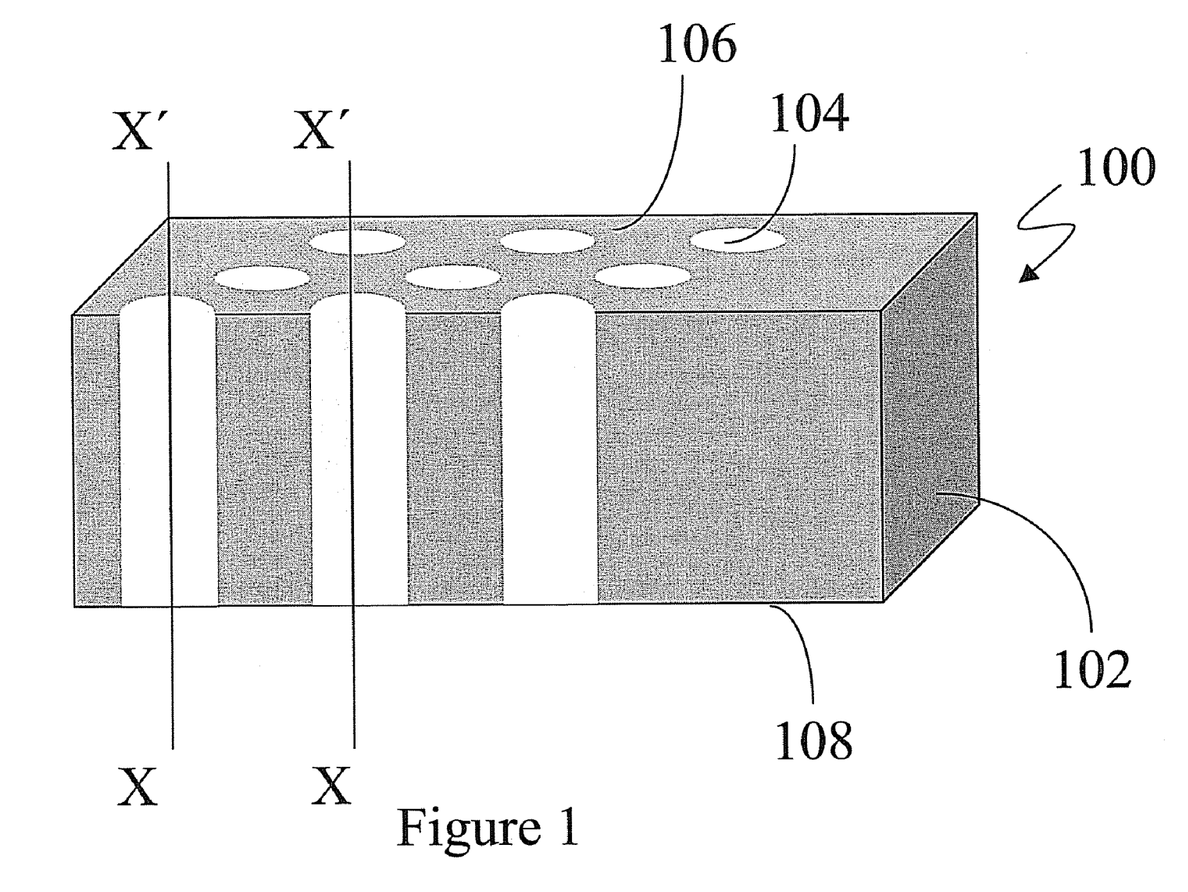
FIG. 1 is an exemplary depiction of the template that is used to manufacture the nanotubes, nanorods and/or nanowires.

With reference now to the FIG. 1, the template 100 that is used to generate the nanorods and/or nanotubes generally comprises a membrane 102 that has pores 104 perpendicular to a first set of faces 106 and 108 respectively. The pores have openings on the faces 106 and 108 through which the piezoelectric and/or pyroelectric polymeric composition can be introduced into the pores. Face 106 will hereinafter be referred to as the first face 106, while face 108 will hereinafter be referred to as the second face 108. As can be seen in the FIG. 1, the first face 106 and the second face 108 are oppositely disposed to one another.

The membrane 102 is generally manufactured from a material that can be easily etched using chemicals or via thermal degradation or mechanical abrasion. The pores 104 can have a cross-sectional geometry that is regular or irregular. In one embodiment, the pores 104 can have a cross-sectional geometry that is circular, ellipsoidal, square, rectangular, polygonal, or the like, or a combination comprising at least one of the foregoing geometries. The pores 104 generally are linear and extend from the first face 106 to the second face 108. It is generally desirable for the template 100 to have a plurality of pores 104 each of which have a longitudinal axis XX' parallel to one another as depicted in the FIG. 1. While it is desirable for the pores 104 present in the template 100 to each have a longitudinal axis XX' that are parallel to one another, some pores 104 can be inclined at an angle θ with respect to other pores 104 (not shown). In addition, some of the pores 104 can be branched (not shown) if desired.

The pores 104 generally have diameters of about 5 to 400 nanometers, specifically about 20 to about 300 nanometers, and more specifically about 30 to about 100 nanometers. The pore lengths can range from sub-micrometer sized dimensions to hundreds of micrometers. The pore lengths are about 100 nanometers to about 100 micrometers, specifically about 200 nanometers to about 50 micrometers and more specifically about 300 nanometers to about 10 micrometers. The pores 104 generally have an aspect ratio about 5 to about 10,000, specifically about 10 to about 1,000, and more specifically about 15 to about 100. In one embodiment, it is desirable for the pore diameters to have a narrow polydispersity index of less than or equal to about 1.1, specifically less than or equal to about 1.08 and more specifically less than or equal to about 1.05.

As noted above, the template 100 can be used to produce an array of nanotubes, nanorods and/or nanowires. It is therefore desirable for the template to comprise a plurality of pores 104 that are parallel to each other. In one embodiment, it is desirable for the template to have a pore density of $10^8$ to about $10^{11}$ per square centimeter (/cm$^2$), specifically about $10^9$ to about $10^{10}$/cm$^2$.

An exemplary membrane 102 is one that comprises anodized aluminum oxide. Anodized aluminum oxide generally has pores that have a diameter of about 15 to about 400 nanometers, with pore lengths ranging from the submicron range to the hundreds of micrometers, with a pore density of $10^{10}$/cm$^2$. The anodized aluminum oxide can be easily etched using an alkali metal hydroxide such as potassium hydroxide or sodium hydroxide.

The electrodes can be manufactured from a suitable electrically conducting material that has a volume resistivity less than about $1 \times 10^{11}$ ohm-cm, specifically less than or equal to about $1 \times 10^6$ ohm-cm. It is desirable for the electrically conducting material to be one that does not easily undergo surface oxidation. If it does undergo surface oxidation, it is desirable that the surface oxide be electrically conductive as well.

In addition it is desirable for the electrodes to be easily disposed upon the first face 106 and the second face 108 of the membrane. In one embodiment, it is desirable for the electrode to comprise a material that can be deposited onto the faces 106 and 108 of the membrane by sputtering. Other methods such as evaporation, chemical vapor deposition, spin coating, dipping, brush painting, electrostatic spray painting, thermal spraying, and the like, may also be used to coat the faces of the membrane. The electrodes are typically in the form of a film having a thickness of about 50 nanometers to about 5 millimeters, specifically about 20 micrometers to about 2 millimeters, and more specifically about 50 micrometers to about 1 millimeter.

The electrodes can be manufactured from a metal, a metal oxide or a polymer so long as it is electrically conducting. Examples of suitable metals are gold, silver, platinum, copper, aluminum, or the like, or a combination comprising at least one of the foregoing metals. Examples of suitable metal oxides are indium tin oxide, antimony tin oxide, tin oxide, or the like, or a combination comprising at least one of the foregoing metal oxides. Examples of suitable electrically conducting polymers are polypyrrole, polythiophene, polyacetylene, polyaniline, or a combination comprising at least one of the foregoing electrically conducting polymers. An exemplary electrode is one manufactured from gold.

Figure 2:
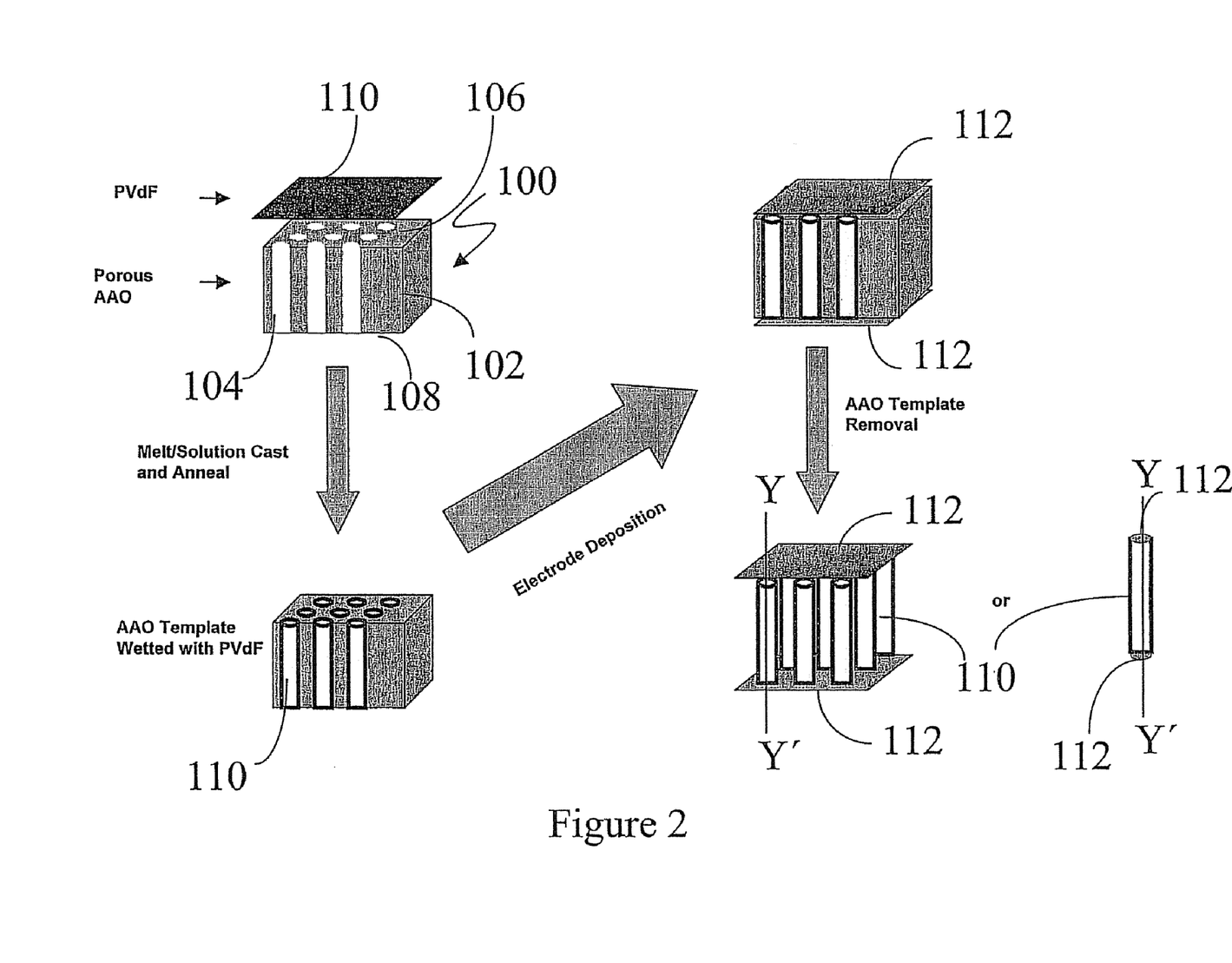
FIG. 2 is an exemplary schematic depiction of one method of making a device that comprises nanotubes, nanorods and/or nanowires; the nanotubes, nanorods and/or nanowires comprising a piezoelectric and/or pyroelectric polymeric composition.

With reference now to the FIG. 2, which depicts one method of manufacturing the device, a template 100 having a plurality of pores 104 is contacted with the piezoelectric and/or pyroelectric polymeric composition 110. The piezoelectric and/or pyroelectric polymeric composition 110 is first melted or dissolved in a suitable solvent to form a solution. In one embodiment, the template 100 is contacted with the piezoelectric and/or pyroelectric polymeric composition 110 (the piezoelectric and/or pyroelectric polymeric composition being either in its molten form or in solution form) and the piezoelectric and/or pyroelectric polymeric composition 110 enters the pores 104 of the template 100 because of capillary forces. In another embodiment, pressure may be applied to permit the piezoelectric and/or pyroelectric polymeric composition 110 to enter the pores 104 of the template 100.

The piezoelectric and/or pyroelectric polymeric composition 110 present in the pores 104 may then be annealed at an appropriate temperature to increase the crystalline content of the polymeric composition. During the annealing the piezoelectric and/or pyroelectric polymeric composition may be subjected to an electric field to orient the crystal axis in the electric field. Following the annealing, the template 100 with the piezoelectric and/or pyroelectric polymeric composition 110 is optionally cooled to below the glass transition temperature of the piezoelectric and/or pyroelectric polymeric composition 110.

Upon solidification of the piezoelectric and/or pyroelectric polymeric composition 110 in the pores 104 of the template 100, a pair of electrodes 112 is disposed upon opposing faces 106 and 108 of the template 100 as shown in the FIG. 2. As noted above, the electrodes 112 may be deposited on the opposing faces of the template 100 by evaporation, sputtering, or the like. In one embodiment, a single pair electrodes 112 having a single composition may be disposed upon the opposing faces 106 and 108 of the template.

In another embodiment, the single pair of electrodes 112 may comprise a plurality of different materials thereby forming a plurality of sub-electrodes. This embodiment is depicted in the FIGS. 2, 3 and 4 respectively. In this embodiment, either a single nanotube, nanorod and/or nanowire or a plurality of nanotubes, nanorods and/or nanowires may contact a pair of sub-electrodes. Pluralities of sub-electrodes can contact each other to form the pair of electrodes 112. This arrangement permits either a single signal to be received from an array or nanorods, nanotubes and/or nanowires in a given device or a plurality of signals to be received from the plurality of nanorods, nanotubes and/or nanowires in the given device.

Figure 3:
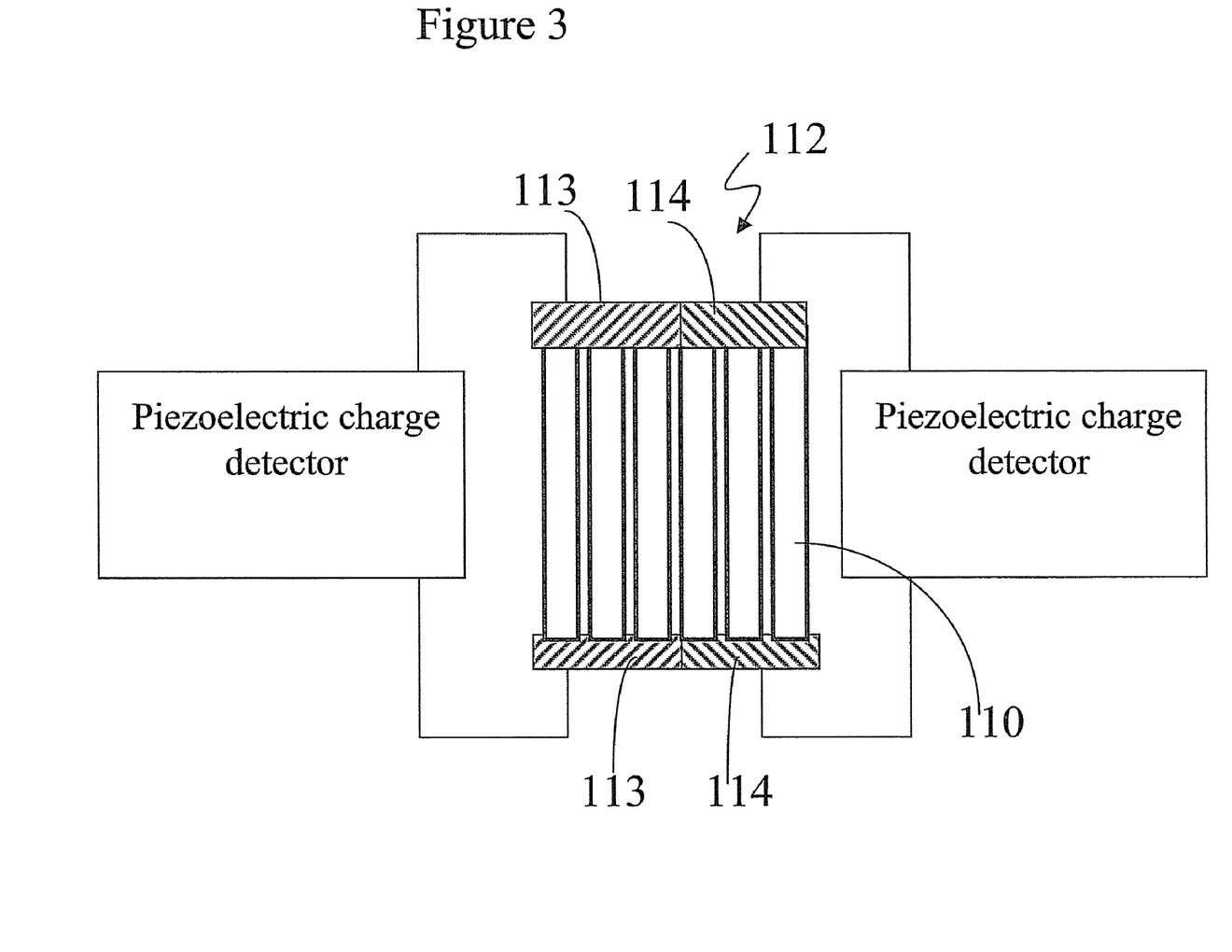
FIG. 3 is an exemplary depiction of a device where the electrodes comprise sub-electrodes.
Figure 4:
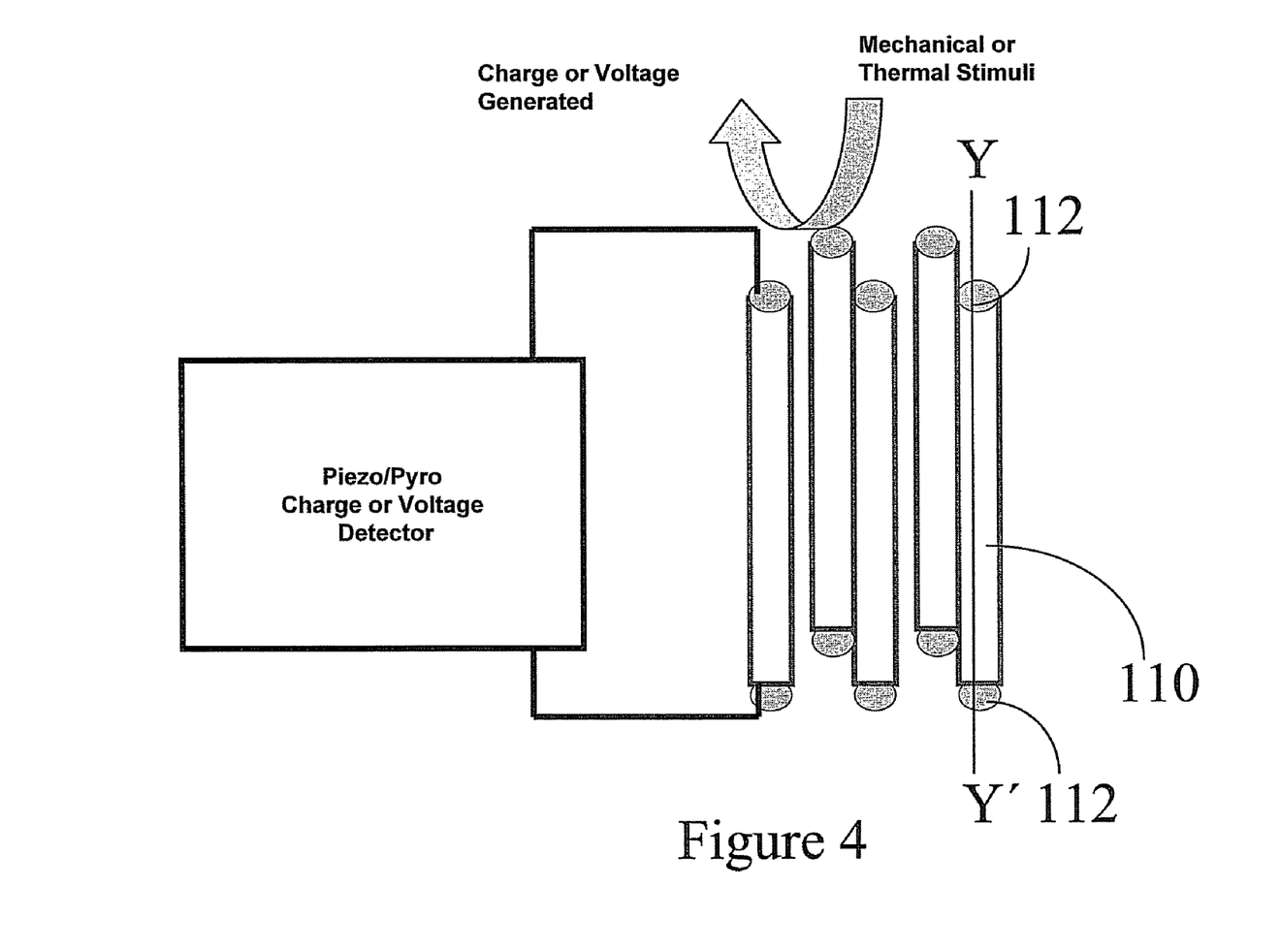

With reference now to the FIG. 3, the pair of electrodes 112 contacting the nanorods comprises two pairs of sub-electrodes—a first sub-electrode 113 and a second sub-electrode 114 respectively. While the FIG. 3 depicts only two pairs of sub-electrodes, it is possible to have a third pair of sub-electrodes, a fourth pair of sub-electrodes, and so on. Each pair of sub-electrodes 113 or 114 contacts the opposing ends of the same nanorods. While the FIG. 3 depicts nanorods it is possible to use nanotubes and/or nanowires as well.

In one embodiment, the respective sub-electrodes can comprise the same or different materials. For example, the first pair of sub-electrodes 113 can comprise steel, while the second pair of sub-electrodes 114 can comprise copper. In addition, each sub-electrode can have a different geometry. For example, while the FIG. 3 shows each pair of sub-electrodes having a rectangular shape, it is possible for the first sub-electrode to have a triangular shape, while the second sub-electrode has a rectangular shape. In this way, each electrode of the pair of sub-electrodes can have a geometry selected from the following list of shapes—square, circular, triangular, rectangular, polygonal, or a combination comprising at least one of the foregoing shapes. Each pair of sub-electrodes can be contacted with an electrical circuit to complete the formation of a device or an article that can be implanted into another device.

In one embodiment, each pair of sub-electrodes can contact a neighboring pair of sub-electrodes. In another embodiment, each sub-electrode can be isolated from a neighboring pair of sub-electrodes by having an electrically insulating layer disposed between them.

As noted above, each pair of sub-electrodes can contact a single nanorod, nanotube and/or nanowire or can contact a plurality of nanorods, nanotubes and/or nanowires. This method advantageously provides the capability to form high-resolution 2-dimensional sensing arrays comprising piezoelectric and pyroelectric polyvinylidene fluoride-containing nanotubes, nanorods and/or nanowires. In one embodiment, as depicted in the FIG. 4, an electrode 112 may be separated from the plurality of electrodes and used in a nanoscale-sensing device. Piezoresponse force microscopy can be used to measure electrical currents in the nano-scale sensing device. It can be used to provide direct information on localized electromechanical activity within the device.

In the manufacturing of the pairs of sub-electrodes, lithographic techniques such as nanolithography, and the like, can be used to pattern the respective sub-electrodes. Photoresists can be used to pattern the respective sub-electrodes.

Following the formation of the electrodes 112 on the opposing faces of the template 100, the template is etched away leaving behind the nanotubes, nanorods and/or nanowires in communication with the electrodes 112. As can be seen in the FIGS. 2 and 3, the surfaces of the electrodes 112 are substantially perpendicular to a longitudinal axis YY' of the nanotubes, nanorods and/or nanowires.

Etching may be conducted by a number of different types of processes. In one embodiment, chemical etching may be used to remove the template and expose the nanotubes, nanorods and/or nanowires. Other forms of etching such as reactive ion etching may also be used to remove the template. Depending upon the type of the template, melting, thermal degradation, irradiation, mechanical abrasion or degradation may also be used to remove the template.

The nanotubes, nanorods and/or nanowires may be subjected to a number of post processing steps. In one embodiment, the surface of the nanorods and/or the nanotubes may be coated with an amorphous carbon or with a reinforcing coating. The electrodes 112 may then be contacted with an electrical circuit to complete the device.

The method disclosed herein has numerous advantages over conventional methods that are used with piezoelectric and/or pyroelectric polymeric compositions. Conventional methods that are used to produce bulk piezoelectric polymeric films limits the size of the films that can be produced as a result of which the film cannot be used in nano- and micro-electro-mechanical systems. The device depicted in the FIGS. 2, 3 and 4 can be easily integrated with nano- and micro-electro-mechanical systems while at the same time providing high resolution and maintaining reasonable sensitivity to thermal and mechanical stimuli. Furthermore, piezoelectric and pyroelectric polymer containing nanotubes, nanorods and/or nanowires integrated with electrode arrays can potentially produce 2-dimensional landscapes of $10^{10}/cm^2$ or $10^6$ pixels per inch (ppi).

The device disclosed herein may advantageously be used for a variety of actuators, sensing devices, electric generators, and the like. It may be used for providing a sensor to any contact, for example, touching with a finger, the impingement of a foreign object, or by objects like cells adhering to a surface, or as a sensor to detect heat or electricity. The device may also be used in the soles of footwear or in wheels or tires to provide a method for harvesting electricity generated during locomotion. The electricity can be used to recharge a battery.

EXAMPLES

This example was conducted to demonstrate that a functional device comprising electrodes and nanorods can be manufactured and does produce an electrical signal when subjected to a stress. An anodized aluminum oxide membrane having a plurality of pores was used as the template. The anodized aluminum oxide membrane was filled with a piezoelectric polymeric composition that comprised polyvinylidene-co-trifluoroethylene (PVdF-TrFE). The anodized aluminum oxide had a layer of aluminum disposed upon one of its opposing faces. The aluminum layer was used as one of the electrodes.

The polyvinylidene-co-trifluoroethylene was introduced into the anodized aluminum oxide at an ambient pressure by placing a film of the polyvinylidene-co-trifluoroethylene on the membrane and by heating the film to a temperature of 200° C. At this temperature the polyvinylidene-co-trifluoroethylene was drawn into the membrane by capillary forces.

Following the entry of the polyvinylidene-co-trifluoroethylene into the pores of the membrane, the surface of the anodized aluminum oxide opposing the surface that is coated with the aluminum is coated with gold. The gold coating was deposited by sputtering. The gold layer and the aluminum layer were then used as electrodes. The membrane was not etched away.

Figure 5:
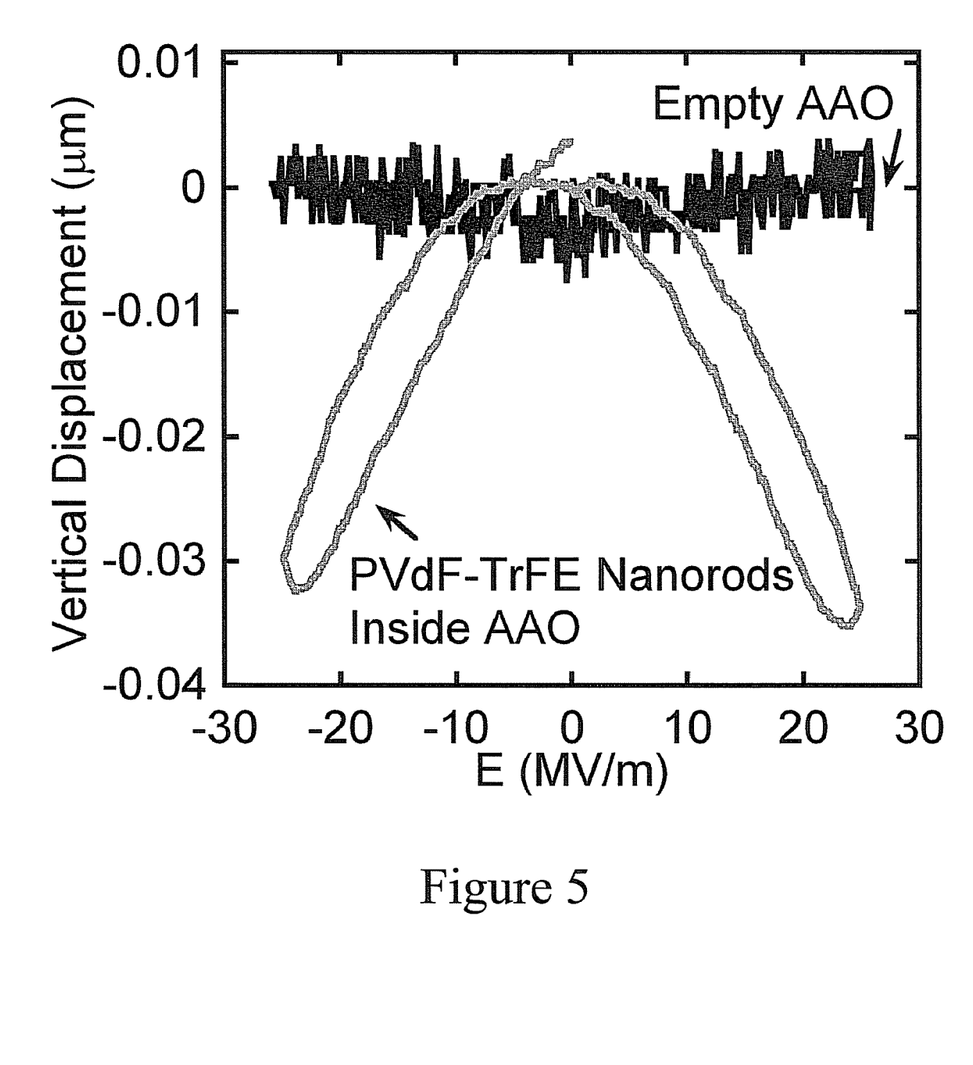
FIG. 5 is a graphical representation that depicts the piezoelectric properties of nanorods disposed in the pores of an anodized aluminum oxide template.

The polyvinylidene-co-trifluoroethylene nanorods disposed within the membrane were then tested by the application of an electric field. The results are shown in the FIG. 5. The FIG. 5 depicts the vertical (axial) displacement of piezoelectric nanorods (in the membrane) that results from the application of the electric field E when the piezoelectric nanorods are supported inside the template. As the electric field is applied, the nanorods will change in length, depending on the direction of the field. The magnitude of the displacement depends on the piezoelectric coefficient. For example, if the piezoelectric coefficient is large in magnitude, then the slope of the displacement-E curve will be large. A non-piezoelectric material, such as anodized aluminum oxide, will have zero slope as shown experimentally in the FIG. 5. However, when the AAO membranes, which are generally used as templates for nanotube and nanorod creation, are filled with a piezoelectric material such as polyvinylidene-co-trifluoroethylene (PVdF-TrFE), piezoelectricity is observed.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A device comprising:
   a pair of electrodes; and
   a nanorod and/or a nanowire; the nanorod and/or nanowire comprising a piezoelectric and/or pyroelectric polymeric composition; the pair of electrodes being in electrical communication with opposing surfaces of the nanorod and/or a nanowire; the pair of electrodes being perpendicular to a longitudinal axis of the nanorod and/or a nanowire.

2. The device of claim 1, further comprising an electrical circuit in electrical communication with the pair of electrodes.

3. The device of claim 1, further comprising an array of nanorods and/or nanowires disposed between the pair of electrodes and in electrical communication with the electrodes.

4. The device of claim 1, wherein the pair of electrodes is substantially perpendicular to a longitudinal axis of the nanorod and/or the nanowire.

5. The device of claim 1, wherein the pair of electrodes comprises an electrically conducting metal, a metal oxide, an electrically conducting polymer, or a combination comprising at least one of the conducting metal, the metal oxide and the electrically conducting polymer.

6. The device of claim 5, wherein the metal is gold, silver, platinum, copper, aluminum, or a combination comprising at least one of the foregoing metals.

7. The device of claim 5, wherein the metal oxide is indium tin oxide, antimony tin oxide, tin oxide, or a combination comprising at least one of the foregoing metal oxides.

8. The device of claim 5, wherein the electrically conducting polymer is a polypyrrole, a polythiophene, a polyacetylene, a polyaniline, or a combination comprising at least one of the foregoing electrically conducting polymers.

9. The device of claim 5, wherein the metal is gold.

10. The device of claim 1, wherein the pair of electrodes comprises pairs of sub-electrodes, each pair of sub-electrodes contacting the nanorod and/or the nanowire.

11. The device of claim 10, wherein the sub-electrodes have surfaces that have different shapes and wherein the shapes are square, rectangular, circular, triangular, polygonal, or a combination comprising at least one of the foregoing shapes.

12. The device of claim 10, wherein each pair of sub-electrodes is insulated from a neighboring pair of sub-electrodes.

13. The device of claim 1, wherein the piezoelectric and/or pyroelectric polymeric composition comprises a polymer that has piezoelectric and/or pyroelectric properties.

14. The device of claim 1, wherein the piezoelectric and/or pyroelectric polymeric composition comprises polyvinylidene fluoride.

15. The device of claim 1, wherein the piezoelectric and/or pyroelectric polymeric composition comprises a piezoelectric filler; wherein the piezoelectric filler is quartz, berlinite, topaz, tourmaline group materials, barium titanate, lead titanate, lead zirconate titanate, potassium niobate, lithium niobate, lithium tantalate, sodium tungstate, $Ba_2NaNb_5O_5$, $Pb_2KNb_5O_{15}$, or a combination comprising at least one of the foregoing piezoelectric fillers.

16. The device of claim 1, wherein the piezoelectric and/or pyroelectric polymeric composition comprises a piezoelectric filler in an amount of up to about 80 weight percent of the total weight of the piezoelectric and/or pyroelectric polymeric composition.

17. The device of claim 1, wherein the piezoelectric and/or pyroelectric polymeric composition comprises an electrically conducting filler.

18. An article that comprises the device of claim 1.

19. The article of claim 18, wherein the article is a nano- and micro-electro-mechanical system.

20. The article of claim 18, wherein the article is a sensor, an actuator or an energy generator.

* * * * *